(12) United States Patent
Christen et al.

(10) Patent No.: US 6,532,569 B1
(45) Date of Patent: Mar. 11, 2003

(54) CLASSIFICATION OF THE VARIABLES IN A SYSTEM OF SIMULTANEOUS EQUATIONS DESCRIBED BY HARDWARE DESCRIPTION LANGUAGES

(75) Inventors: Ernst Christen, Beaverton, OR (US); Gordon J. Vreugdenhil, Beaverton, OR (US); Martin Vlach, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 282 days.

(21) Appl. No.: 09/590,862

(22) Filed: Jun. 8, 2000

Related U.S. Application Data

(60) Provisional application No. 60/140,268, filed on Jun. 18, 1999.

(51) Int. Cl.$^7$ ............................................... G06F 17/50
(52) U.S. Cl. ................................................. 716/2; 716/5
(58) Field of Search ........................... 703/3, 4, 13, 14; 716/5, 1, 2

(56) References Cited

FOREIGN PATENT DOCUMENTS

EP    1 067 467 A1 * 6/2000 ........... G06F/17/50

OTHER PUBLICATIONS

Frey, P. et al., "SEAMS: simulation environment for VHDL–AMS", Dec. 1998, IEEE, pp. 539–546.*
Damon, D. et al., "Introduction to VHDL–AMS. 1. Structural and discrete time concepts", Nov. 1996, IEEE, pp. 264–269.*
Borchers, C., "Symbolic behavioral model generation of nonlinear analog circuits", Oct. 1998, IEEE, pp. 1362–1371.*
Christen, E. et al., "VHDL 1076.1–analog and mixed–signal extensions to VHDL", Sep. 1996, IEEE, pp. 556–561.*
S. E. Mattson, M. Anderson, K. J. Astrom, "Object–oriented Modeling and Simulation", in "CAD for Control Systems", D. A. Linkens (Ed.), Marcel Dekker, New York, Basel, Hong Kong, 1993, pp. 57–69.
I.S. Duff, A. M. Erisman, J. K. Reid, "Direct Methods for Sparse Matrices", "Chapter 6 Reduction to Block Triangular Form", Clarendon Press, Oxford, 1986, reprinted 1992, pp. 104–113.
I.S. Duff, A. M. Erisman, J. K. Reid, "Direct Methods for Sparse Matrices", "Chapter 11 Partitioning, Matrix Modification, and Tearing", Clarendon Press, Oxford, 1986, reprinted 1992, pp. 241–263.
C.–W. Ho, A. E. Ruehli, P. A. Brennan, "The Modified Nodal Approach to Network Analysis", IEEE Trans. Circ. Sys., vol. CAS–22, No. 6, Jun. 1975, pp. 504–509.

* cited by examiner

*Primary Examiner*—John F. Niebling
*Assistant Examiner*—Stacy Whitmore
(74) *Attorney, Agent, or Firm*—Silicon Valley Patent Group LLP; Omkar K. Suryadevara

(57) ABSTRACT

In simulating a physical circuit or system including analog and mixed signal digital-analog components, a physical circuit or system includes components defined as instances of models. There can be multiple instances of any model in the physical circuit or system. For each model, a sub-system of simultaneous equations is determined. The variables in the sub-systems of simultaneous equations are classified as input, output, intermediate, or system variables. Equations are associated with each variable, and the sub-systems of simultaneous equations are reduced by eliminating all equations not associated with system variables. The system of simultaneous equations describing the physical circuit or system is assembled from the sub-systems of simultaneous equations. For each instance of a model, a copy of the sub-system of simultaneous equations for that model is added to the system of simultaneous equations. The system of simultaneous equations can then be solved, and the results used to analyze the behavior of the physical circuit or system.

23 Claims, 3 Drawing Sheets

CLASSIFICATION OF THE VARIABLES IN A SYSTEM OF SIMULTANEOUS EQUATIONS DESCRIBED BY HARDWARE DESCRIPTION LANGUAGES

RELATED APPLICATION DATA

This application claims priority from U.S. Provisional Application No. 60/140,268, filed Jun. 18, 1999.

FIELD OF THE INVENTION

The present invention relates to the field of computer simulation of analog and mixed signal digital-analog physical circuits and systems, and more particularly to the reduction of a system of simultaneous equations describing the analog and mixed signal digital-analog physical circuits and systems to be simulated.

BACKGROUND OF THE INVENTION

Hardware description languages such as VHDL-AMS allow a user to write simulation models of physical devices by expressing their behavior using statements of the language. Continuous time (often called analog) behavior is described by statements that express differential-algebraic equations. Such equations are called explicit equations.

When many instances of such models are connected together to form a hierarchical design, the explicit equations from each instance, together with implicit equations resulting from declarations and the interconnection of the instances, and equations supplied by the simulator, are combined into a system of simultaneous equations with many unknowns. Some implicit equations due to interconnections are a consequence of the conservation laws (Kirchhoff's voltage and current laws in electrical systems; equivalent laws exist in other systems such as thermal, fluidic, etc.). The conservation laws require that the potential of all terminals connected to form a node be equal, and that the flow (in electrical systems, current) into each node sum up to zero.

It is known that for the system of simultaneous equations to be solvable there must be as many equations as there are unknowns. The system of simultaneous equations is typically very sparse (i.e., most equations in the system involve relatively few variables), and in most situations the system of simultaneous equations can be compacted (reduced in size). Compacting the systems of simultaneous equations is beneficial because the computational effort to solve a system of simultaneous equations is of the order $n^k$, where n is the size of the system of simultaneous equations and k is a number larger than one that depends on the particular system of simultaneous equations. Therefore, reducing the size of the system of simultaneous equations provides for a more efficient solution, making the simulation more efficient.

There are known approaches, called tearing methods, that reduce a system of equations without significantly changing the sparsity of the system. These methods operate on fully assembled system of equations and identify certain unknowns as "input variables" and "output variables" of the system of equations. Input variables are those unknowns that either have fixed values or that depend on only other input variables. Output variables are those unknowns whose values do not feed back into the solution or that affect only other output variables. The identification of input variables and output variables allows those variables and their defining equations to be removed from the system of simultaneous equations, since input variables can be evaluated prior to the simultaneous solution, and output variables afterwards. But because tearing methods start with a fully assembled system of simultaneous equations, the effort required to reduce the size of the system of simultaneous equations is generally large.

Accordingly, a need exists for a way to reduce the size of a system of simultaneous equations by reducing a system of simultaneous equations based on individual models in the physical circuit or system before the complete system of simultaneous equations is assembled.

SUMMARY OF THE INVENTION

A simulator analyzes the behavior of analog and mixed signal digital-analog physical circuits and systems in a digital computer, using suitable models for each component in the physical circuit or system. According to the invention, sub-systems of simultaneous equations are assembled for each model. The variables in each sub-system of simultaneous equations are classified and the size of the sub-systems reduced. Finally, the system of simultaneous equations describing the physical circuit or system as a whole is assembled from the reduced sub-systems of simultaneous equations, and can be solved.

The foregoing and other objects, features and advantages of the invention will become more readily apparent from the following detailed description of a preferred embodiment, which proceeds with reference to the drawings.

DETAILED DESCRIPTION OF THE PREFERRED EMBODIMENT

Introduction

Figure 1:
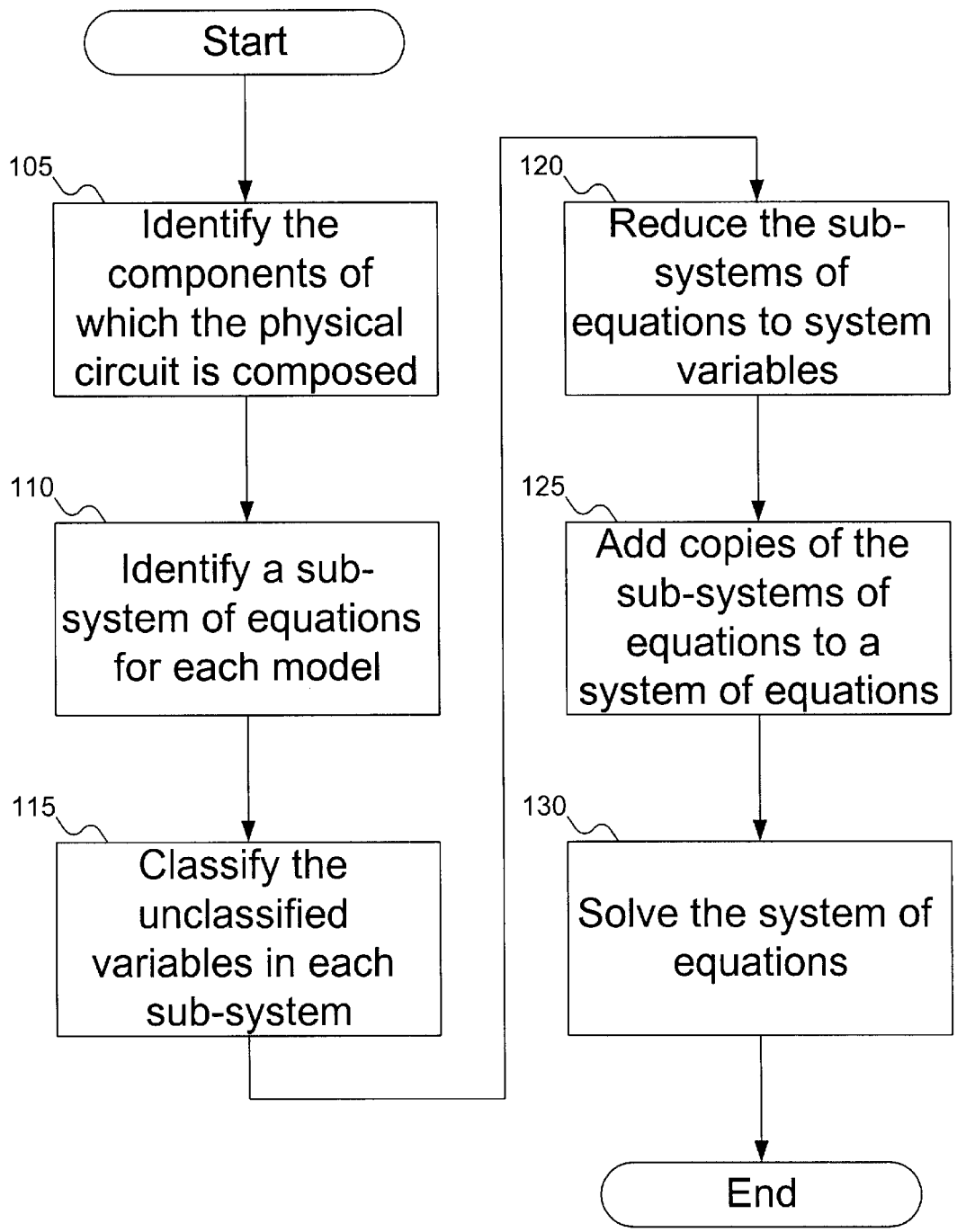
FIG. 1 is a flowchart of a method using a computer system to classify variables according to the invention.

This invention covers two related but independent aspects of reducing the size of the system of simultaneous equations. First, it includes a method that allows the identification of "input variables" and "output variables" based on information from a single model rather than the fully assembled system. The benefit of making this determination by using only "local" information is apparent when there are many instances of the same model in a design supplied by the user, since then the identification must be done only once. Second, the invention includes a method that allows a further reduction of the size of the system of equations by dividing the remaining unknowns into intermediate variables and system variables, using information from the single model. Only system variables enter the system of simultaneous equations; the values of intermediate variables are obtained by evaluating assignments.

The invention is further described by reference to a simple, illustrative example. Table 1 shows a simple model of a linear resistor in parallel with an ideal capacitor written in the VHDL-AMS language. However, although the VHDL-AMS language has been used in the example and has influenced the terminology used to describe the invention, the invention is not restricted to models written using the VHDL-AMS language.

TABLE 1

```
ENTITY rc IS
    GENERIC (rvalue: real; cvalue: real);
    PORT (TERMINAL p, m: electrical);
END ENTITY rc;
ARCHITECTURE simple OF rc IS
    QUANTITY v ACROSS i THROUGH p TO m;
    QUANTITY dpower: real;
BEGIN
    i == v / rvalue + cvalue * v'dot;
    dpower == v * v / rvalue;
END ARCHITECTURE simple;
```

An instance of this model connected between nodes vcc and vee with an rvalue of 1000 and a cvalue of $1.0 \times 10^{-9}$ could be created by a statement of the form shown in Table 2:

TABLE 2

```
r1:    ENTITY rc
       GENERIC MAP (rvalue => 1.0e3, cvalue => 1.0e-9)
       PORT MAP (p => vcc, m => vee);
```

In this example, the unknowns in each instance of this model are v, i, dpower, and v'dot. There are two explicit equations, one implicit equation resulting from the declaration of v that is a consequence of Kirchhoff's voltage law and one equation supplied by the simulator defining the value of v'dot as the derivative of v with respect to time. Additionally, the potential at each terminal is an unknown (although the value of the potential at each terminal is identical to the value of the potential at the node to which it is connected, the value of the potential at the node is unknown), and each instance of the model contributes some current to each terminal. The current contribution can be described by two equation fragments that together with equation fragments from other instances connected to the same node will eventually form a complete equation.

DESCRIPTION OF THE CLASSIFICATION METHOD

The classification method starts by listing all explicit, implicit and simulator supplied equations and equation fragments as well as all unknowns. For the example of Table 1, these are shown in Table 3:

TABLE 3

```
explicit equations:       i = v / rvalue + cvalue * v'dot
                          dpower = v * v / rvalue
implicit equations:       v = potential(p) - potential(m)
simulator supplied equations:  v'dot = time_derivative (v)
equation fragments:       i             contribution to p
                          -i            contribution to m
unknowns:                 v, i, dpower, v'dot, potential(p),
                          potential (m)
```

The classification then proceeds by identification of transforms, non-local system variables, input variables, output variables, intermediate variables, and local system variables. All variables that are not system variables (i.e., input variables, output variables, transforms, and intermediate variables) can be called non-system variables. Part of each identification is the association of an equation with each classified unknown. The unknown itself does not have to appear in the equation with which it is associated.

Transforms

Any unknown that has a special meaning according to the language definition is classified as a transform. Examples of transforms are the time-derivative transform (in VHDL-AMS: unknowns of the form Q'Dot), the ideal delay transform (in VHDL-AMS: unknowns of the form Q'Delayed (T)), or the integral transform (in VHDL-AMS: unknowns of the form Q'Integ). The value of the transform is defined by an implicit equation supplied by the simulator. This equation is associated with the transform.

In the equations of Table 3, v'dot is classified as a transform. Its associated equation is v'dot=time_derivative (v).

Non-local System Variables

Any unknown that is declared (explicitly or implicitly) in the interface of a model becomes a system variable since its value depends on information that is not local to the instance of the model. If the unknown is the potential at a terminal, the equation fragment defining the contribution to the terminal is associated with the unknown.

Any unknown that is connected in an instantiation statement with an unknown declared in the interface of the instantiated model becomes a system variable.

In the equations of Table 3, potential(p) and potential(m) are system variables. Their associated equation fragments are, respectively, i and -i.

Input Variables

An input variable is characterized by the fact that it is the only unknown in an equation. The equation can be either explicit or implicit. The value of the input variable is therefore determined by this one equation, which becomes associated with the unknown as its defining equation. If the same unknown is made an input variable by more than one equation, then this can be identified at this stage and reported as an error, since the resulting system of equations will be singular in this case.

Identification of input variables is iterative. Once an unknown has been identified as an input variable, it is deemed known, and further unknowns may subsequently be classified as input variables using the remaining equations. The order in which the input variables are identified is the order in which their values are determined.

There are no input variables in the example of Table 3.

Output Variables

An output variable is characterized by the fact that it appears in exactly one equation. The defining equation can be either explicit or implicit. The value of the output variable is therefore determined by that one equation, which becomes associated with the unknown. The value can be determined once the values of the other unknowns in the equation are determined. If the same equation makes more than one unknown an output variable, then this can be identified at this stage and reported as an error, since the resulting system of equations will be singular in this case.

Identification of output variables is iterative. Once an unknown has been identified as an output variable and its associated equation has been removed from further consideration, other unknowns may subsequently be classified as output variables using the remaining equations. The order in which the output variables are identified is the reverse order in which their values are determined.

In the equations of Table 3, dpower is an output variable since it appears in only one equation. Its associated equation is dpower=v * v/rvalue.

Intermediate Variables and Local System Variables

Unknowns can be identified as intermediate variables by symbolically solving an equation for the unknown and substituting the result into the other equations.

Any unknown that appears exactly once in an equation is a candidate for substitution. The unknown must either stand by itself on the left-hand side or the right-hand side of an equation, or it may be added to, or subtracted from, the left-hand side or the right-hand side of an equation. Substitution is done repeatedly, one unknown at a time.

Substitutions are done in the following sequence:

Step 1: Any unknown that is declared as an across variable is classified as an intermediate variable, and the implicit equation defining its value becomes its associated equation. This choice yields a system of equations that uses a so-called modified nodal formulation. In VHDL-AMS, an across variable is a quantity whose name precedes the word ACROSS in the quantity declaration; in Table 1, v is an across variable.

Step 2: An unknown that either stands by itself on the left-hand side or the right-hand side of an equation, or that is added to, or subtracted from, the left-hand side or the right-hand side of an equation, is a candidate for being classified as an intermediate variable, provided that the equation does not depend on other unclassified variables.

Step 3: Pick the first candidate in the order in which they appear in the model. If the corresponding equation does not depend on transforms, or if it depends only on time-derivative transforms or ideal delay transforms, classify the unknown as an intermediate variable; otherwise classify it as a local system variable. Associate the equation with the newly classified variable.

Repeat steps 2 and 3 until no more intermediate variables can be found.

The order of the substitutions establishes the evaluation order of the intermediate variables.

For the equations of Table 3, the following classifications can be made:

Step 1 classifies v as an intermediate variable; its associated equation is v=potential(p)−potential(m).

Step 2 makes i a candidate for being classified as an intermediate variable.

Step 3 classifies i as an intermediate variable; its associated equations is i=v rvalue +cvalue * v'dot.

All remaining unknowns are candidates for becoming system variables. However, classifying one variable as a local system variable may make it possible for other unknowns to be classified as intermediate variables. Thus, after an unknown is classified as a local system variable and one of the remaining equations is associated with the local system variable, the classification of intermediate variables is repeated. This interleaved classification of intermediate variables and local system variables is repeated until all unknowns have been classified.

Procedure

Now that the specifics of the preferred embodiment have been explained by reference to a simple, illustrative example, the method implementing the invention can be described. Referring to FIG. 1, at step 105, the system identifies the components of which the physical circuit or system is composed. Each component is defined as an instance of a model. Different components in the physical circuit or system can be defined as instances of the same model, or can be defined as instances of different models. At step 110, a sub-system of simultaneous equations is identified for each model. If a model does not contain any equations, then it is not considered by the preferred embodiment of the invention. Typically, only models of analog or mixed signal analog-digital components contain equations, as the behavior of digital components generally is not described by simultaneous equations. However, a person skilled in the art will recognize that the invention can be applied as well to digital components that are described by simultaneous equations.

At step 115 of FIG. 1, the variables in each sub-system of simultaneous equations are classified using the described procedure, and equations are associated with each variable. At step 120, the sub-systems of simultaneous equations are reduced to only equations associated with system variables. At step 125, copies of each sub-system of simultaneous equations are added to the system of simultaneous equations, one copy for each instance of the model. The sub-systems of simultaneous equations are combined using information from the physical circuit or system, specifying how the model instances interact at nodes or terminals. (Nodes and terminals are very similar concepts, both representing junctions between elements of the circuit. The difference lies in the declaration of the junction. Terminals are places where the model interacts with other components of the circuit outside itself; nodes are strictly internal to the definition of the model. But because models can be nested, a node for one model may be a terminal for another model.) Finally, at step 130, once the system of simultaneous equations is assembled, the system can be solved in simulation of the physical circuit or system. The results can be used to analyze the performance of the physical circuit or system.

Figure 2:
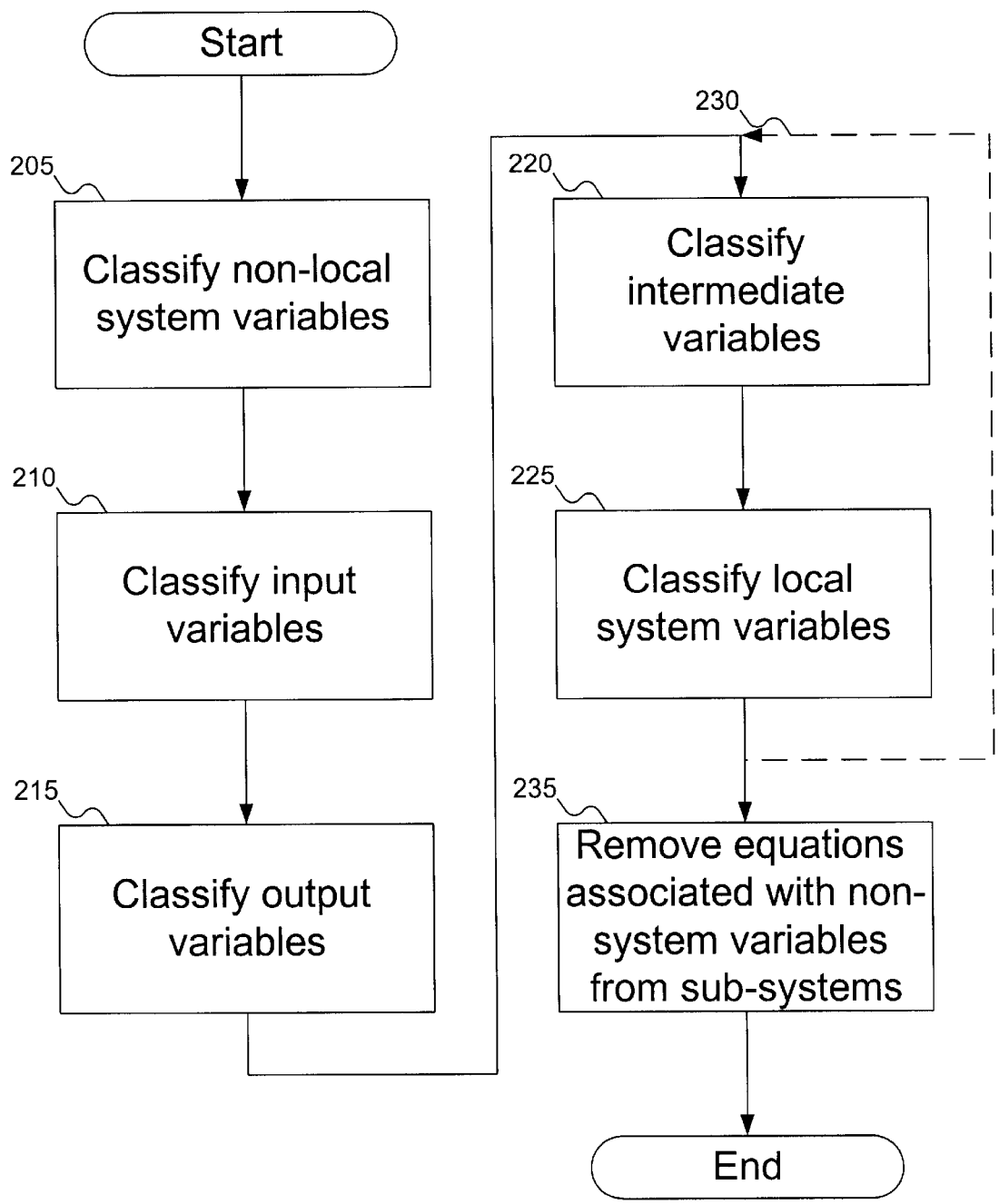
FIG. 2 is a flowchart of a method the sequence in which variables are classified in FIG. 1.

FIG. 2 shows the sequence in which variables are classified at step 115 in FIG. 1. At step 205, non-local system variables are classified. At step 210, input variables are classified. At step 215, output variables are classified. At step 220, intermediate variables are classified. At step 225, local system variables are classified. As shown by dashed line 230, classifying intermediate and local system variables is an iterative process. Finally, at step 235; equations associated with non-system variables are removed from the sub-system of equations for the model.

Figure 3:
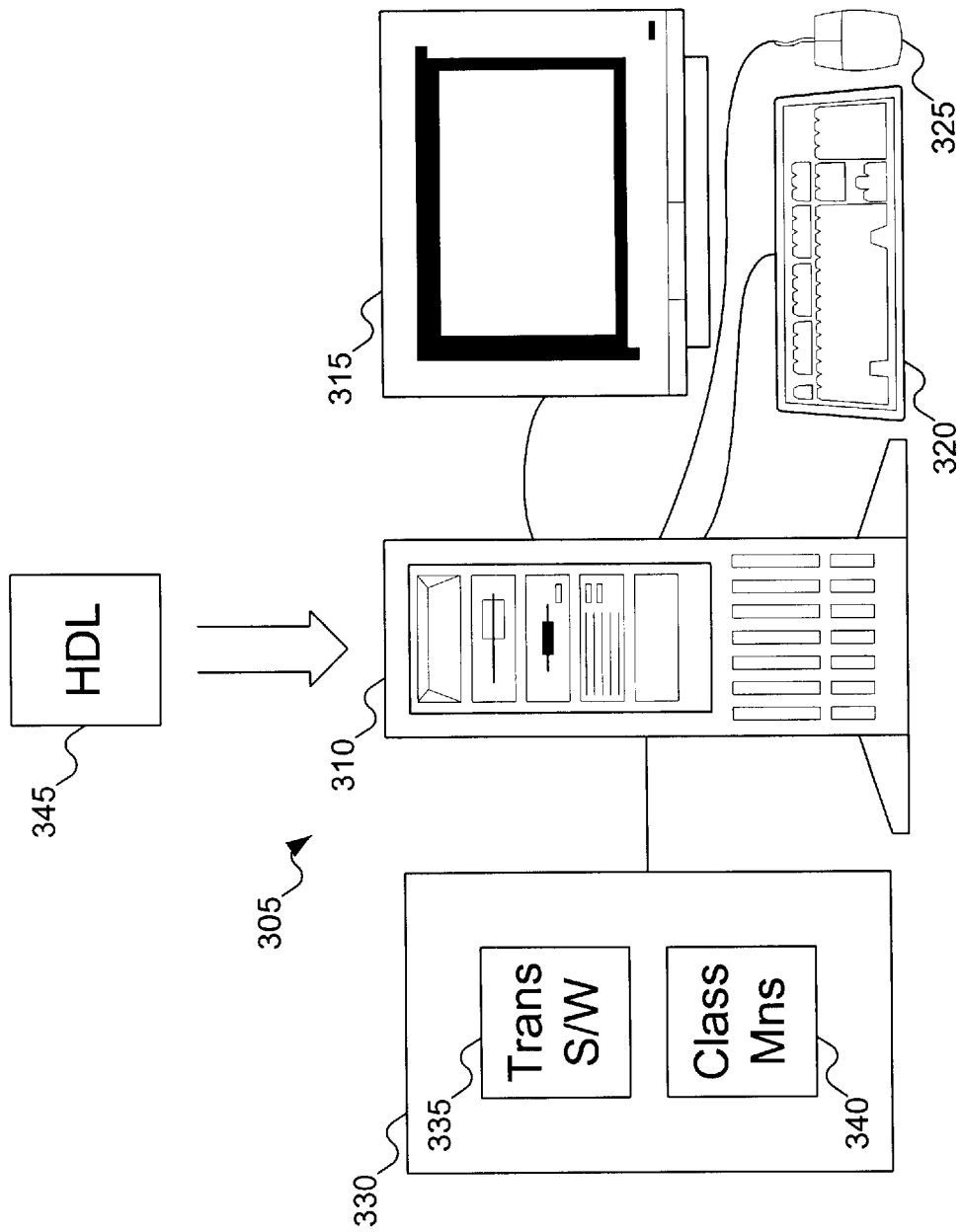
FIG. 3 is a block diagram of a computer system implementing the invention.

FIG. 3 shows a computer system implementing the invention. In FIG. 3, computer system 305 includes a computer 310, a monitor 315, a keyboard 320, and a mouse 325. Other components may be part of the computer system 305, even though not shown in FIG. 3. For example, computer system 305 can include other input/output devices, such as a plotting device. Similarly, devices such as monitor 315, keyboard 320, and mouse 325 can be missing from the computer system 305, provided that some input and output devices exist. Computer system 305 also includes simulator 330. Simulator 330 performs the simulation of analog and mixed signal digital-analog physical circuits and systems. Simulator 330 includes translation software 335 and classification means 340. Translation software 335 translates a hardware description language description of a physical circuit or system, such as HDL file 345, into the systems of equations. Classification means 340 is responsible for classifying the variables in the system of equations produced by translation software 335 according to the method described with reference to FIGS. 1 and 2.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying an unclassified variable includes, in order:

classifying non-local system variables;

classifying input variables;

classifying output variables; and classifying intermediate and local system variables.

2. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying an unclassified variable includes classifying an unclassified variable as a non-local system variable if the unclassified variable is a potential of a node or terminal of the model.

3. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying a variable includes classifying an unclassified variable as an input variable if the unclassified variable is the only unclassified variable in an equation in the sub-system of simultaneous equations.

4. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying a variable includes classifying an unclassified variable as an output variable if the unclassified variable appears in only one equation in the sub-system of simultaneous equations.

5. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying a variable includes classifying an unclassified variable as an intermediate variable.

6. A method according to claim 5, wherein classifying an unclassified variable as an intermediate variable includes classifying an unclassified variable as an intermediate variable if the unclassified variable is declared as a difference of potential of two nodes or terminals of the model.

7. A method according to claim 5, wherein classifying an unclassified variable as an intermediate variable includes classifying an unclassified variable as an intermediate variable if the unclassified variable is defined by an equation consisting only of classified variables and does not depend on a transform.

8. A method according to claim 5, wherein classifying an unclassified variable as an intermediate variable includes classifying an unclassified variable as an intermediate variable if the unclassified variable is defined by an equation consisting only of classified variables, time-derivative transforms, and ideal delay transforms.

9. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying an unclassified variable includes classifying an unclassified variable as a local system variable if the unclassified variable is defined by an equation including a transform that is neither time-derivative transform nor an ideal delay transform.

10. A method according to claim 9, wherein classifying an unclassified variable as a local system variable includes associating the equation including the transform that is neither a time-derivative transform nor an ideal delay transform with the system variable.

11. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying an unclassified variable includes iteratively classifying unclassified variables as intermediate variables and local system variables.

12. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying an unclassified variable includes:
associating an equation with a variable classified as a non-system variable; and
removing the associated equation from the sub-system of simultaneous equations.

13. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein classifying an unclassified variable includes reducing each sub-system of simultaneous equations to a reduced sub-system of simultaneous equations associated only with system variables; and wherein assembling the sub-systems of simultaneous equations includes adding a copy of the reduced sub-system of simultaneous equations to the reduced system of simultaneous equations for each instance of each model in the physical circuit or system.

14. A method for classifying variables in a system of simultaneous equations describing a physical circuit or system in a hardware description language, the circuit including an analog component, the method comprising:

identifying at least two components of which the physical circuit or system is composed, each component defined as an instance of a model containing a sub-system of simultaneous equations, said model being one of a plurality of models;

assembling the sub-systems of simultaneous equations for each model;

classifying an unclassified variable based on the sub-system of simultaneous equations for each model thereby to reduce the size of the sub-systems; and assembling the system of simultaneous equations describing the physical circuit or system as a whole from reduced sub-systems of simultaneous equations;

wherein assembling the sub-systems of simultaneous equations includes adding a copy of the sub-system of simultaneous equations to the system of simultaneous equations for each instance of each model in the physical circuit or system.

15. A computer-readable medium containing a program implementing a method for classifying variables in a system of simultaneous equations describing a physical circuit or system in a hardware description language, the circuit including an analog component, the program comprising:

identification software to identify at least two components of which the physical circuit or system is composed, each component defined as an instance of a model containing a sub-system of simultaneous equations, said model being one of a plurality of models;

classification software to classify an unclassified variable in each sub-system of simultaneous equations for each model; and assembly software to assemble the sub-systems of simultaneous equations and to assemble the system of simultaneous equations describing the physical circuit or system;

wherein the classification software includes second classification software to classify an unclassified variable as a non-local system variable if the unclassified variable is the potential of a node or terminals of the model.

16. A computer-readable medium containing a program implementing a method for classifying variables in a system of simultaneous equations describing a physical circuit or system in a hardware description language, the circuit including an analog component, the program comprising:

identification software to identify at least two components of which the physical circuit or system is composed, each component defined as an instance of a model containing a sub-system of simultaneous equations, said model being one of a plurality of models;

classification software to classify an unclassified variable in each sub-system of simultaneous equations for each model; and assembly software to assemble the sub-systems of simultaneous equations and to assemble the system of simultaneous equations describing the physical circuit or system;

wherein the classification software includes second classification software to classify an unclassified variable as an intermediate variable.

17. A computer-readable medium containing a program according to claim 16, wherein the second classification software includes third classification software to classify an unclassified variable as an intermediate variable if the unclassified variable is declared as a difference of potential of two nodes or terminals of the model.

18. A computer-readable medium containing a program according to claim 16, wherein the second classification software includes third classification software to classify an unclassified variable as an intermediate variable if the unclassified variable is defined by an equation consisting only of classified variables and does not depend on a transform.

19. A computer-readable medium containing a program according to claim 16, wherein the second classification software includes third classification software to classify an unclassified variable as an intermediate variable if the unclassified variable is defined by equation consisting only of classified variables, time-derivative transforms, and ideal delay transforms.

20. A computer-readable medium containing a program implementing a method for classifying variables in a system of simultaneous equations describing a physical circuit or system in a hardware description language, the circuit including an analog component, the program comprising:

identification software to identify at least two components of which the physical circuit or system is composed, each component defined as an instance of a model containing a sub-system of simultaneous equations, said model being one of a plurality of models;

classification software to classify an unclassified variable in each sub-system of simultaneous equations for each model; and assembly software to assemble the sub-systems of simultaneous equations and to assemble the system of simultaneous equations describing the physical circuit or system;

wherein the classification software includes second classification software to classify an unclassified variable as a local system variable if the unclassified variable is defined by an equation including a transform that is neither a time-derivative transform nor an ideal delay transform.

21. A computer-readable medium containing a program implementing a method for classifying variables in a system of simultaneous equations describing a physical circuit or system in a hardware description language, the circuit including an analog component, the program comprising:

identification software to identify at least two components of which the physical circuit or system is composed, each component defined as an instance of a model containing a sub-system of simultaneous equations, said model being one of a plurality of models;

classification software to classify an unclassified variable in each sub-system of simultaneous equations for each model; and assembly software to assemble the sub-systems of simultaneous equations and to assemble the system of simultaneous equations describing the physical circuit or system;

wherein the classification software includes iteration software to iteratively classify unclassified variables as intermediate variables and system variables.

22. A computer-readable medium containing a program implementing a method for classifying variables in a system of simultaneous equations describing a physical circuit or system in a hardware description language, the circuit including an analog component, the program comprising:

identification software to identify at least two components of which the physical circuit or system is composed, each component defined as an instance of a model containing a sub-system of simultaneous equations, said model being one of a plurality of models;

classification software to classify an unclassified variable in each sub-system of simultaneous equations for each model; and assembly software to assemble the sub-systems of simultaneous equations and to assemble the system of simultaneous equations describing the physical circuit or system;

wherein the classification software includes reduction software to reduce each sub-system of simultaneous equations to a reduced sub-system of simultaneous equations associated only with system variables; and wherein the second assembly software includes adding software to add a copy of the reduced sub-system of simultaneous equations to the reduced system of simultaneous equations for each instance of each model in the physical circuit or system.

23. A computer-readable medium containing a program implementing a method for classifying variables in a system of simultaneous equations describing a physical circuit or system in a hardware description language, the circuit including an analog component, the program comprising:

identification software to identify at least two components of which the physical circuit or system is composed, each component defined as an instance of a model containing a sub-system of simultaneous equations, said model being one of a plurality of models;

classification software to classify an unclassified variable in each sub-system of simultaneous equations for each model; and assembly software to assemble the sub-systems of simultaneous equations and to assemble the system of simultaneous equations describing the physical circuit or system;

wherein the assembly software includes adding software to add a copy of the sub-system of simultaneous equations to the system of simultaneous equations for each instance of each model in the physical circuit or system.

* * * * *

UNITED STATES PATENT AND TRADEMARK OFFICE
CERTIFICATE OF CORRECTION

PATENT NO. : 6,532,569 B1
DATED : March 11, 2003
INVENTOR(S) : Christen et al.

It is certified that error appears in the above-identified patent and that said Letters Patent is hereby corrected as shown below:

Column 1,
Line 5, insert -- This invention was made with government support under cooperative agreement F30602-96-2-0309 awarded by the Air Force. The Government has certain rights in the invention. --.

Signed and Sealed this

Seventh Day of September, 2004

JON W. DUDAS
*Director of the United States Patent and Trademark Office*